(12) United States Patent
Liu

(10) Patent No.: US 11,233,158 B2
(45) Date of Patent: Jan. 25, 2022

(54) SEMICONDUCTOR POWER DEVICE AND METHOD FOR MANUFACTURE

(71) Applicant: SEMICONDUCTOR COMPONENTS INDUSTRIES, LLC, Phoenix, AZ (US)

(72) Inventor: Mingjiao Liu, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 56 days.

(21) Appl. No.: 16/667,631

(22) Filed: Oct. 29, 2019

(65) Prior Publication Data
US 2021/0050458 A1 Feb. 18, 2021

Related U.S. Application Data

(60) Provisional application No. 62/887,759, filed on Aug. 16, 2019.

(51) Int. Cl.
| | |
|---|---|
| *H01L 27/07* | (2006.01) |
| *H01L 29/861* | (2006.01) |
| *H01L 29/868* | (2006.01) |
| *H01L 29/66* | (2006.01) |
| *H01L 29/47* | (2006.01) |

(52) U.S. Cl.
CPC ............ *H01L 29/868* (2013.01); *H01L 29/47* (2013.01); *H01L 29/6609* (2013.01)

(58) Field of Classification Search
None
See application file for complete search history.

(56) References Cited

U.S. PATENT DOCUMENTS

| | | | | |
|---|---|---|---|---|
| 2012/0267681 | A1* | 10/2012 | Nemoto | H01L 29/1095 257/139 |
| 2016/0163654 | A1* | 6/2016 | Nakanishi | H01L 23/552 257/140 |
| 2017/0110449 | A1* | 4/2017 | Gejo | H01L 29/207 |
| 2019/0287963 | A1* | 9/2019 | Kondoh | H01L 27/0629 |
| 2020/0105874 | A1* | 4/2020 | Yilmaz | H01L 21/2855 |

OTHER PUBLICATIONS

Y. Amemiya, T. Sugeta, and Y. Mizushima, "Novel low-loss and high speed diode utilizing an "Ideal" ohmic contact," IEEE Transactions on Electron Devices (vol. ED-29, No. 2, Feb. 1982).

M.T. Rahimo, and N.Y.A. Shammas, "A review on fast power diode development and modern novel structures," IEE Colloquium on New Developments in Power Semiconductor Devices (Digest No. 1996 /046, Jun. 21-26, 1997, London, UK).

* cited by examiner

*Primary Examiner* — Joseph C. Nicely
*Assistant Examiner* — Lamont B Koo
(74) *Attorney, Agent, or Firm* — Brake Hughes Bellermann LLP

(57) ABSTRACT

A device includes a first doped semiconductor region and a second oppositely doped semiconductor region that are separated by an undoped or lightly-doped semiconductor drift region. The device further includes a first electrode structure making an ohmic contact with the first doped semiconductor region, and a second electrode structure making a universal contact with the second doped semiconductor region. The universal contact of the second electrode structure allows flow of both electrons and holes into, and out of, the device.

18 Claims, 13 Drawing Sheets

400

```
┌─────────────────────────────────────────────────────────────────┐
│  Form an Epitaxial Layer on a Semiconductor Substrate 410       │
└─────────────────────────────────────────────────────────────────┘
                                │
┌─────────────────────────────────────────────────────────────────┐
│  Form an Anode Structure of the Fast Recovery Diode (FRD)       │
│                             420                                  │
└─────────────────────────────────────────────────────────────────┘
                                │
┌─────────────────────────────────────────────────────────────────┐
│  Reduce a Thickness of the Semiconductor Substrate 430          │
└─────────────────────────────────────────────────────────────────┘
                                │
┌─────────────────────────────────────────────────────────────────┐
│  Form a Universal Contact Structure on a Back Surface of the    │
│                  Semiconductor Substrate 440                     │
└─────────────────────────────────────────────────────────────────┘
                                │
┌─────────────────────────────────────────────────────────────────┐
│  Deposit a Metal on a Back Surface of the Universal Contact     │
│     Structure to Form a Cathode Structure of FRD 450            │
└─────────────────────────────────────────────────────────────────┘
```

FIG. 4

SEMICONDUCTOR POWER DEVICE AND METHOD FOR MANUFACTURE

TECHNICAL FIELD

The present disclosure relates to devices for power electronics such as a free-wheeling or flyback diode that can be connected across an inductor and used to eliminate flyback, which is the sudden voltage spike seen across an inductive load when its supply current is suddenly reduced or interrupted.

BACKGROUND

A free-wheeling or flyback diode (also called fast recovery diode (FRD) herein) is used to prevent damage to circuits that typically include a load that has an inductor and a switching potential. An inductor cannot change current immediately. Attempting to change the current rapidly such as when a switch opens after an inductor has built up energy, will cause the inductor to generate large electromotive forces (EMFs). A free wheeling diode placed anti-parallel to the inductor provides a short circuit path for a flow of inductor decay current and hence dissipation of the energy stored in the inductor.

In power electronic circuits for many switching applications (e.g., industrial and automotive inverter applications) semiconductor devices (e.g., a metal oxide semiconductor field effect transistor (MOSFET), an insulated-gate bipolar transistor (IGBT), etc.) are used as switches to apply power to inductive loads. In the power electronic circuits, a free-wheeling diode is placed anti parallel to the switch (e.g., IGBT) to provide a return path for inductor discharge currents. An FRD can contribute to significant power loss in a switching circuit (e.g., in the power inverter application of an IGBT). It is important that the FRD is designed for a stable operation without oscillation, and for low electromagnetic interference (EMI) in the switching circuit. A desirable FRD may have low loss, fast switching, and soft reverse current recovery characteristics. Attaining these FRD characteristics can involve a trade-off between diode parameters such as low forward voltage (VF), low reverse recovery charge (Qrr), and between high operating voltage and soft reverse current recovery.

SUMMARY

In a general aspect, a device includes a first doped semiconductor region and a second oppositely doped semiconductor region that are separated by an undoped or lightly-doped semiconductor drift region. The device further includes a first electrode structure making an ohmic contact with the first doped semiconductor region, and a second electrode structure making a universal contact with the second doped semiconductor region. The universal contact of the second electrode structure allows flow of both electrons and holes into, and out of, the device.

In an aspect, an alternating array of P+ doped semiconductor regions and N+ doped semiconductor regions in the second electrode structure make the universal contact with the second doped semiconductor region.

In a general aspect, a device includes a first doped semiconductor region and a second oppositely doped semiconductor region that are separated by an undoped or lightly-doped semiconductor drift region. The device further includes a first electrode structure making an ohmic contact with the first doped semiconductor region, and a second electrode structure including an alternating array of P+ doped semiconductor regions and N+ doped semiconductor regions in contact with second doped semiconductor region. The second electrode structure includes an oxide layer disposed between a metal layer and the P+ doped semiconductor regions and the N+ doped semiconductor regions of the alternating array.

In an aspect, the oxide layer covers the P+ doped semiconductor regions and extends partially over the N+ doped semiconductor regions of the alternating array, in the second electrode structure.

In a general aspect, a method includes growing an n-type epitaxial layer on a N-type semiconductor substrate, forming an anode structure on a top surface of the n-type epitaxial layer, back grinding the N-type semiconductor substrate to reduce its thickness, and forming a cathode structure on a back surface of the back-ground N-type semiconductor substrate. Forming the cathode structure includes forming a universal contact structure on the back surface of the back-ground semiconductor substrate and depositing a back metal on the back surface of universal contact structure.

BRIEF DESCRIPTION OF THE DRAWINGS

FIG. 4 is an illustration of example method for fabricating a diode with soft recovery characteristics, consistent with the present disclosure.

DETAILED DESCRIPTION

A p-i-n diode includes two oppositely doped semiconductor regions that are separated by an undoped or lightly-doped semiconductor drift region. Each of the two oppositely doped semiconductor regions is in electrical contact (ohmic contact) with a respective electrode (i.e., an anode or a cathode) of the device which allows flow of charge carriers (i.e., holes or electrons) into, and out of, the respective doped semiconductor region of the diode.

In accordance with the principles of the present disclosure, at least one of the electrodes is configured as a universal contact that allows flow of both holes and electrons) into, and out of, the respective doped semiconductor region of the diode.

The universal contact to a doped semiconductor region of the diode may have a structure that includes both P-doped semiconductor regions and N-doped semiconductor regions in contact with the respective doped semiconductor region of the diode. The P-doped semiconductor regions and N-doped semiconductor regions may be present in different areas of the universal contact. A p-to-n areal ratio can be used as a figure of merit to describe a ratio of an area of the universal contact occupied by P-doped semiconductor regions and an area of the universal contact occupied by N-doped semiconductor regions. The p-to-n areal ratio is selected in consideration of the reverse current recovery time of the device, and in consideration of the forward current of the device.

Figure 1A:
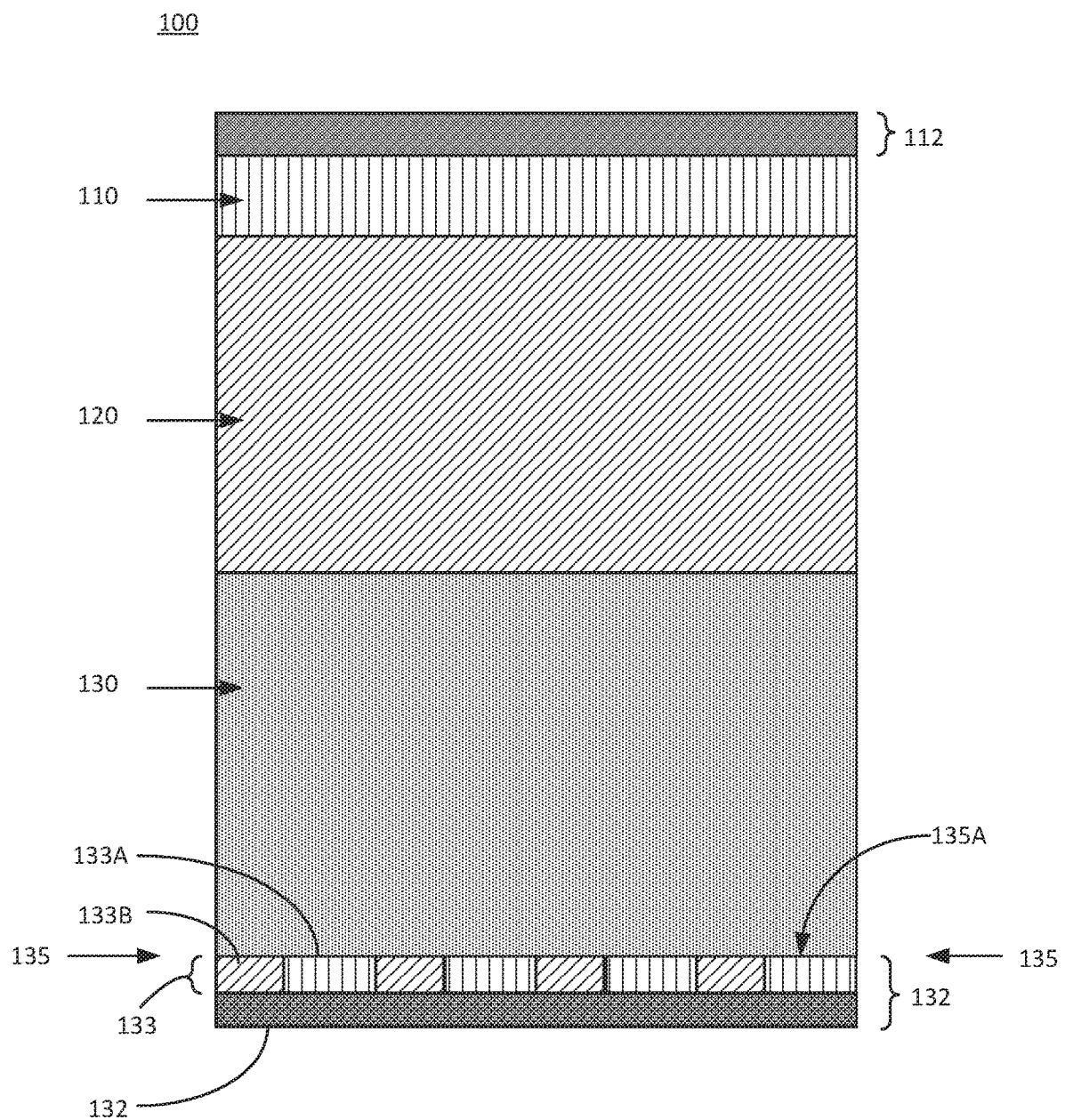
FIGS. 1A and 1B are diagrams that illustrate electrode structures of a p-i-n diode, consistent with the present disclosure.

FIG. 1A illustrates an example structure of an example free wheeling diode (e.g., FRD 100), in accordance with the principles of the present disclosure. FRD 100 may have soft recovery characteristics for use in power switching circuits.

With reference to FIG. 1A, FRD 100 which may have a p-i-n diode-like structure that includes two oppositely doped semiconductor regions (110, 130) that are separated by a semiconductor drift region 120. Semiconductor region 110 may, for example, be a p-doped semiconductor region, and semiconductor region 130 may be an n-doped semiconductor region. Semiconductor drift region 120 may, for example, be a semiconductor region that is undoped or is lightly doped compared to the two oppositely doped semiconductor regions 110, 130. The two oppositely doped semiconductor regions 110, 130 may be heavily doped because they are used for making electrode structures (e.g., anode structure 112 and cathode structure 132, respectively) of FRD 100.

Anode structure 112 may, for example, be a metal or metal alloy layer that makes ohmic contact with semiconductor region 110 (e.g., a p-doped semiconductor region) allowing transport of holes into semiconductor region 110.

Further, in accordance with the principles of the present disclosure, a device electrode structure (e.g., cathode structure 132) may include a universal contact structure 133 interposed between a metal or metal alloy layer 134 and semiconductor region 130 (e.g., n-doped semiconductor region). Universal contact structure 133 may include a semiconductor region (e.g., semiconductor region 133A of opposite polarity to that of semiconductor region 130) forming a p-n junction 135A along at least a part of an interface 135 between universal contact structure 133 and semiconductor region 130. In example implementations, universal contact structure 133 may include at least one pair of semiconductor regions (133A, 133B) that alternate in a lateral direction (along interface 135 between universal contact structure 133 and semiconductor region 130). Semiconductor region 133A may for example, be a heavily P+ doped semiconductor region, while semiconductor region 133B may for example, be a heavily N+ doped semiconductor region. Semiconductor region 133A (a backside p doped region) forms a p-n junction 135A (a backside p-n junction) with a part of a lateral area or extent of semiconductor region 130 along interface 135.

In example implementations, the semiconductor regions (133A, 133B) of the universal contact structure 133 may occupy different areas along interface 135.

Figure 1B:
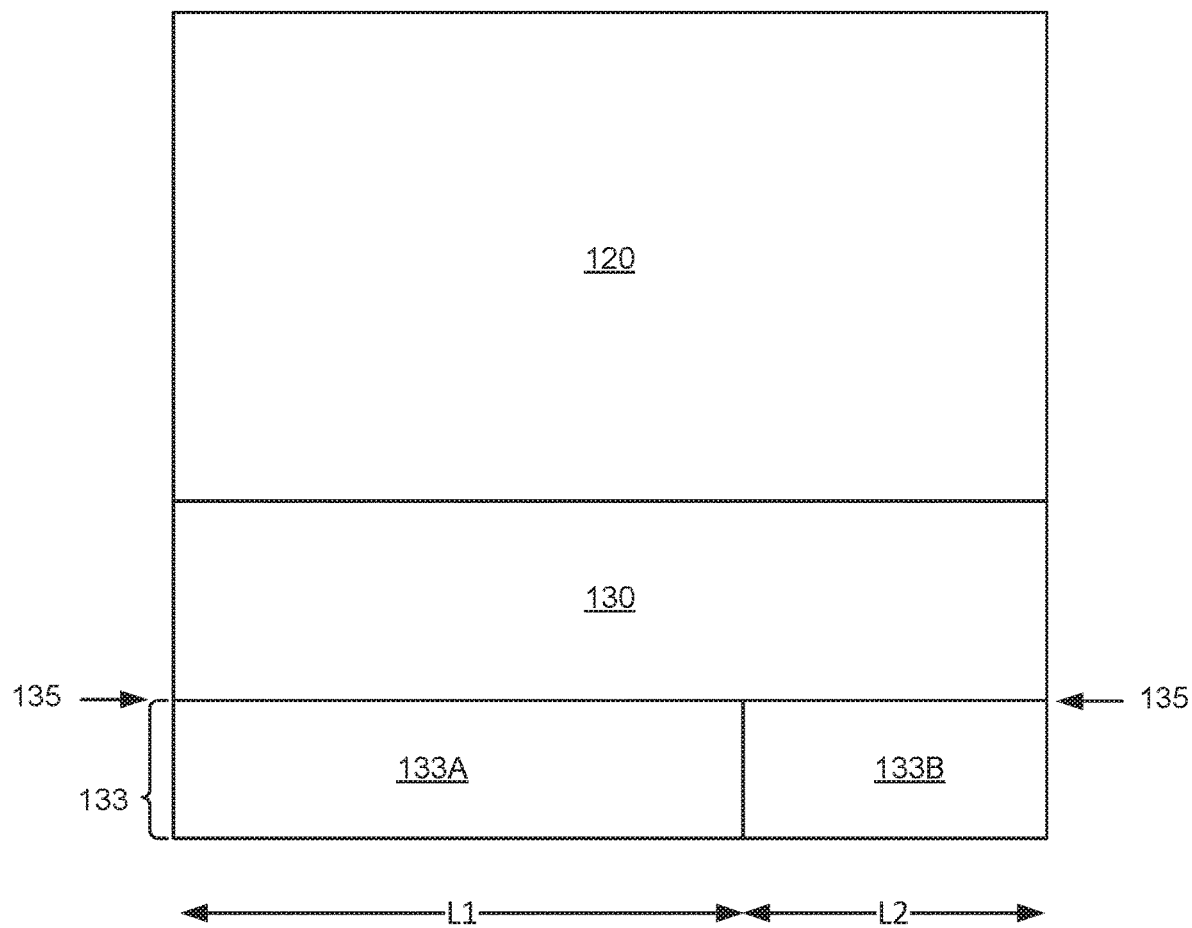

FIG. 1B (which is an exploded partial cross-sectional view of FRD 100 shown in FIG. 1A) shows, for example, semiconductor region 133A as being present along a length L1 of interface 135, while semiconductor regions 133B as being present along a different length L2 of interface 135. Thus, in the example shown in FIG. 1B, semiconductor region 133A and semiconductor region 133B of universal contact structure 133 are present (assuming a same depth of the semiconductor regions perpendicular to the plane of FIG. 1B) in an areal ratio of L1:L2 along interface 135. The areal ratio of semiconductor region 133A and semiconductor region 133B along interface 135 may be referred to hereinafter as the p-to-n areal ratio of the universal contact structure 133.

Universal contact structure 133 may make a contact with semiconductor region 130 that allows transport of both holes and electrons into semiconductor region 130. The holes may be transported into semiconductor region 130, for example, via P+ doped semiconductor regions 133A, and the electrons may be transported into semiconductor region 130, for example, via N+ doped semiconductor regions 133B.

When switching from a conducting to a blocking state, FRD 100 has stored charge (e.g., reverse recovery charge (Qrr)) in, for example, semiconductor drift region 120, that must first be discharged before FRD 100 blocks reverse current. This discharge takes a finite amount of time known as the reverse recovery time, or $t_{rr}$. Cathode structure 132 by allowing transport of holes into FRD 100 via P+ doped semiconductor regions 133A (in addition to the transport of holes into semiconductor region 110 via the ohmic contact made by anode structure 112) would increase the reverse recovery time of FRD 100 over that of a conventional p-i-n diode structure (not shown) with conventional ohmic anode and cathode contacts (i.e., non-universal contacts) by increasing the tail of reverse recovery current.

Figure 2:
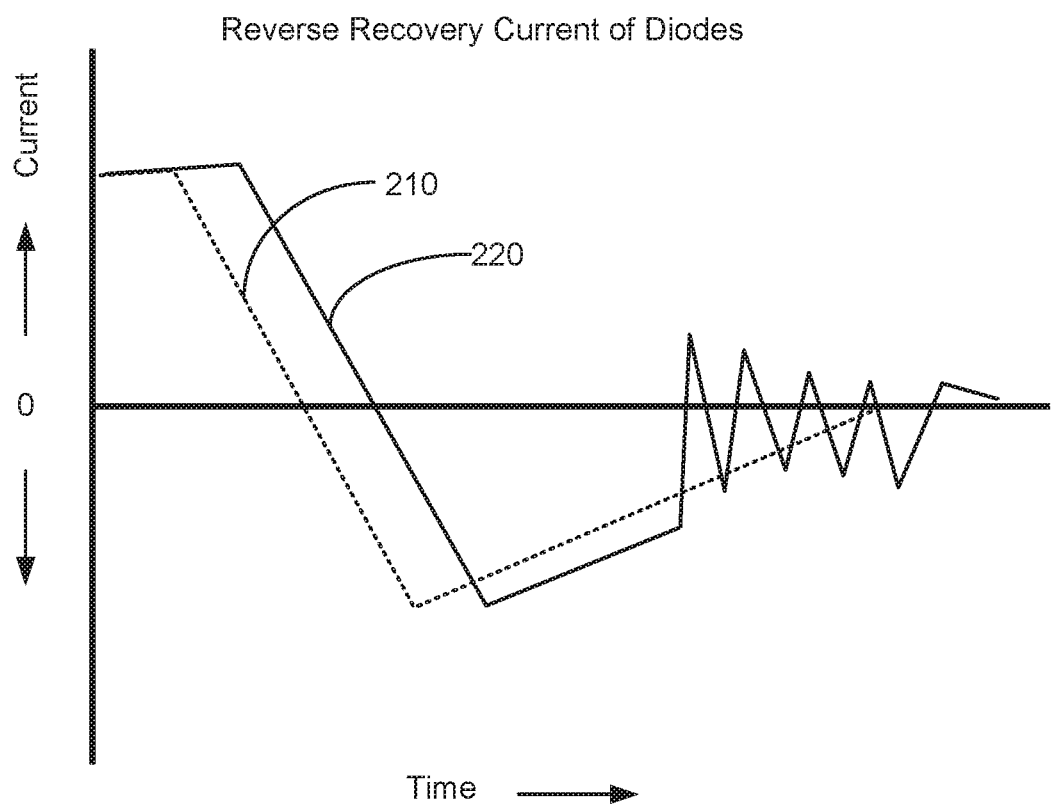
FIG. 2 illustrates a reverse recovery current of the p-i-n diode of FIG. 1A, consistent with the present disclosure.

The increased reverse recovery time $t_{rr}$ of FRD 100 can contribute to a soft recovery characteristic of FRD 100. FIG. 2 shows schematically a reverse recovery current 210 of FRD 100, which has a reverse recovery time $t_{rr}$. FIG. 2 also shows schematically, for comparison, a reverse recovery current 220 of a conventional p-i-n diode, which has a comparable reverse recovery time $t_{rr}$.

As shown in FIG. 2, reverse recovery current 210 of FRD 100 has a smooth profile gradually returning to a zero value and hence may be characterized as being a "soft" recovery. In contrast, reverse recovery current 220 of the conventional p-i-n diode has a noisy (i.e., snappy, not smooth) return to a zero value and hence may be characterized as being a "hard" recovery.

Figure 3:
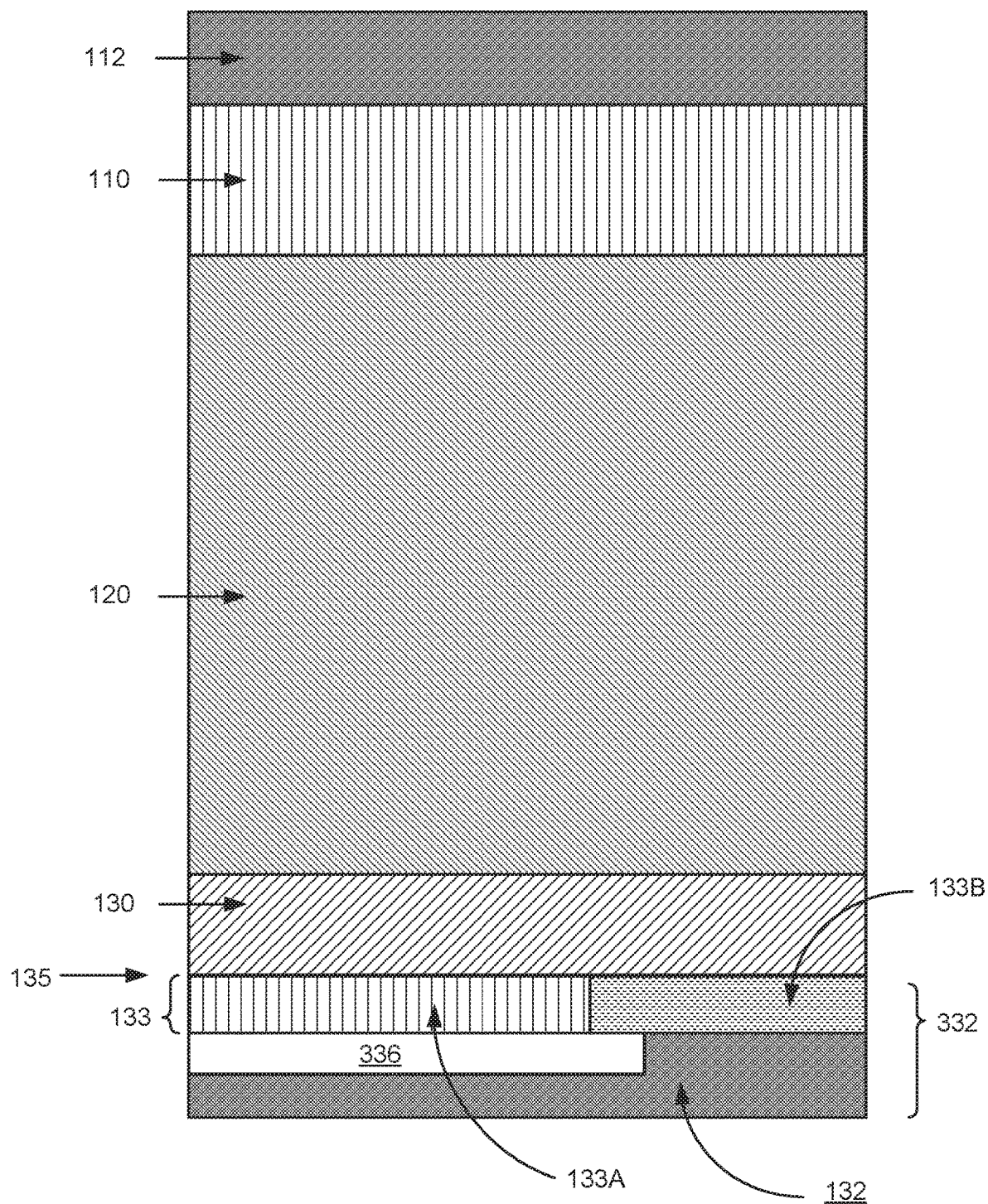
FIG. 3 illustrates a diode with an example cathode structure including a universal contact to a diode, consistent with the present disclosure.

FIG. 3 illustrates FRD 100 with another example cathode structure for a universal contact to a diode, in accordance with the principles of the present disclosure. As shown in FIG. 3, FRD 100 can include a different cathode structure 332 other than cathode structure 132 shown in FIG. 1A.

Cathode structure 332 while generally similar to cathode structure 132 of FRD 100 (shown in FIG. 1A), further includes an oxide layer 336 interposed between universal contact structure 133 and metal layer 132. In example implementations, oxide layer 336 may overlay P+ semiconductor region 133A and may extend partially over N+ semiconductor region 133B. Oxide layer 336 overlaying P+ semiconductor region 133A may act as a barrier to the flow of holes, prevent leakage of holes out of FRD 100 through cathode 332, and further improves the characteristics of the diode.

FIG. 4 illustrates a method 400 for fabricating an FRD (e.g., FRD 100) with soft recovery characteristics. FIGS. 5A-5F, which may be viewed in conjunction with FIGS. 1A and 1B (and FIG. 3), schematically illustrate a cross-sectional view of portions of a semiconductor substrate as it is being processed at different stages or steps of method 400 to make FRD 100.

As shown in FIG. 4, method 400 includes growing an n-type epitaxial layer on a N-type semiconductor substrate (e.g., an N+ doped silicon substrate) (410). The n-type epitaxial layer (which forms a drift region, e.g., semiconductor region 120 of FRD 100) may be undoped or lightly doped at a concentration lower than that of the N-type semiconductor substrate Method 400 further includes forming an anode structure of the FRD (420). Forming the anode structure may include forming a P+ layer on a top surface of the n-type epitaxial layer and depositing a metal layer on the P+ layer to form an anode structure of FRD 100. The P+ layer may be formed by thermal diffusion, and/or implantation, of p dopant species into the top surface of the n-type epitaxial layer.

Method 400 further includes back grinding the semiconductor substrate to reduce its thickness (430). The reduced thickness of the back-ground semiconductor substrate may correspond to a thickness of a buffer layer of FRD 100.

Method 400 further includes forming a universal contact (e.g., universal contact structure 133) on a back surface of the back-ground semiconductor substrate (440). Forming the universal contact may involve a buffer implantation (e.g., of an n dopant such as phosphorus), followed by a p dopant (e.g., boron) implantation into the back surface of the back-ground semiconductor substrate. Forming the universal contact may further involve a photolithographic patterning step to delineate the P+ regions 133A and the N+ regions 133B of universal contact structure 133, followed by n dopant (e.g., phosphorus) implantation to form the N+ regions 134B. A laser annealing step may be carried out to activate the foregoing dopants in universal contact structure 133.

Method 400 further includes depositing a back metal on a back surface of universal contact structure 133 to form a cathode structure of FRD 100 (450).

In example implementations, where FRD 100 includes cathode structure 332 (shown in FIG. 3), forming a universal contact on a back surface of the back-ground semiconductor substrate 440 in method 400 may include patterning and depositing an oxide layer (e.g., oxide layer 336) over P+ region 133A and partially over N+ regions 133B. The oxide layer may be deposited before depositing the back metal on the back surface of universal contact structure 133.

As previously noted, FIGS. 5A-5F, schematically illustrate a cross-sectional view of portions of a semiconductor substrate as it is being processed at different stages or steps of method 400 to make FRD 100.

Figure 5C:
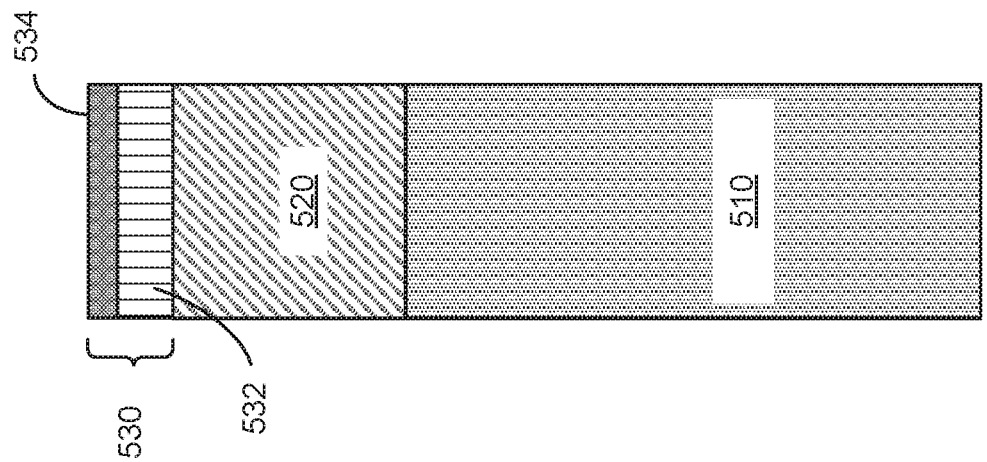
FIGS. 5A through 5F schematically illustrate a cross-sectional view of portions of a semiconductor substrate as it is being processed at different stages or steps of the method of FIG. 4 to make a diode.
Figure 5B:
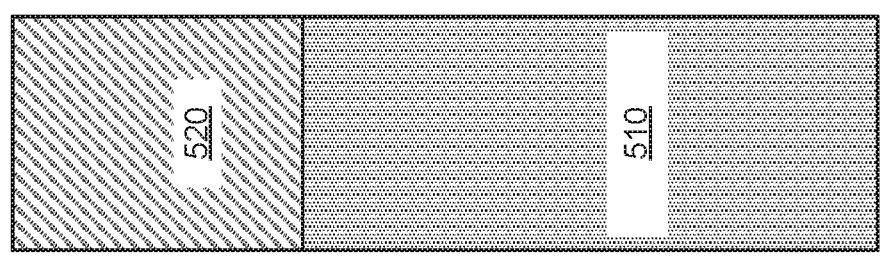
Figure 5A:
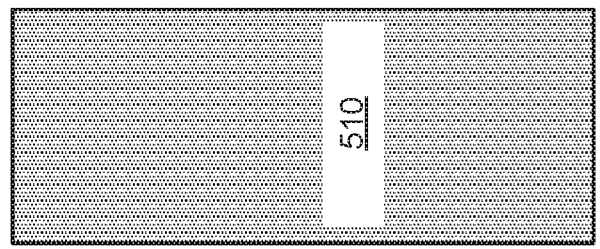

FIG. 5A shows, for example, a portion of a semiconductor substrate 510 that is being processed by method 400 to make FRD 100. In example implementations, semiconductor substrate 510 may be an N+ silicon wafer with resistivity in the range of about 0.001-50 Ω·cm.

FIG. 5B shows, for example, at step 410 of method 400, an epitaxial layer 520 grown on semiconductor substrate 510. In example implementations, epitaxial layer 520 may be a undoped or lightly doped epitaxial layer with a resistivity, for example, in the range of 20-200 Ω·cm and have a thickness, for example, in a range of about 10-100 μm.

FIG. 5C shows, for example, at step 420 of method 400, formation of an anode structure 530 of FRD 100. Anode structure 530 may, for example, include a P+ layer 532 on a top surface of epitaxial layer 520 and a metal layer 534 deposited on the P+ layer 532.

Figure 5F:
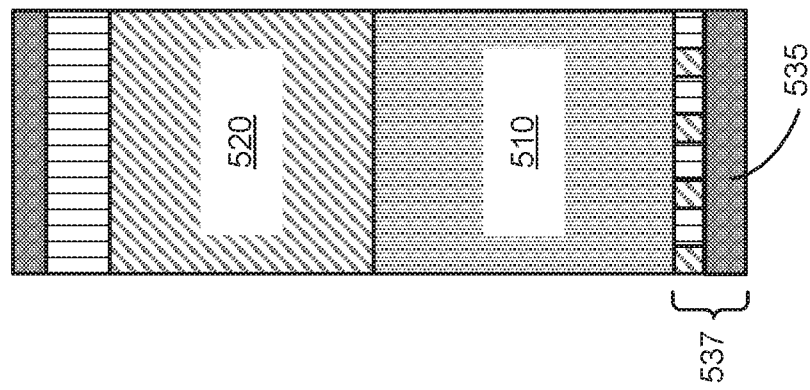
Figure 5E:
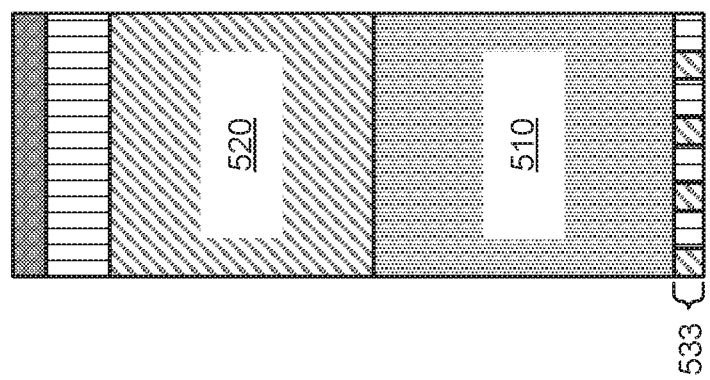
Figure 5D:
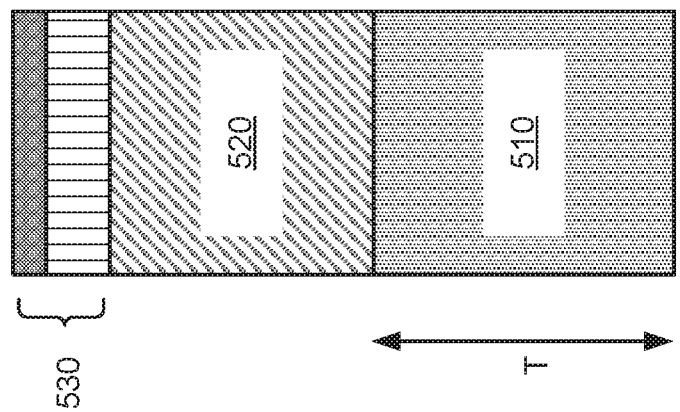

FIG. 5D shows, for example, semiconductor substrate 510 with a reduced thickness T after it has been back ground at step 430 of method 400, FIG. 5E shows, for example, at step 440 of method 400, formation of a universal contact 533 (having alternating P doped and N doped regions) on a backside of semiconductor substrate 510 with reduced thickness T.

FIG. 5F shows, for example, at step 450 of method 400, a back metal 535 deposited on a back surface of universal contact 533 to form a cathode structure 537 of FRD 100 (450).

Figure 6A:
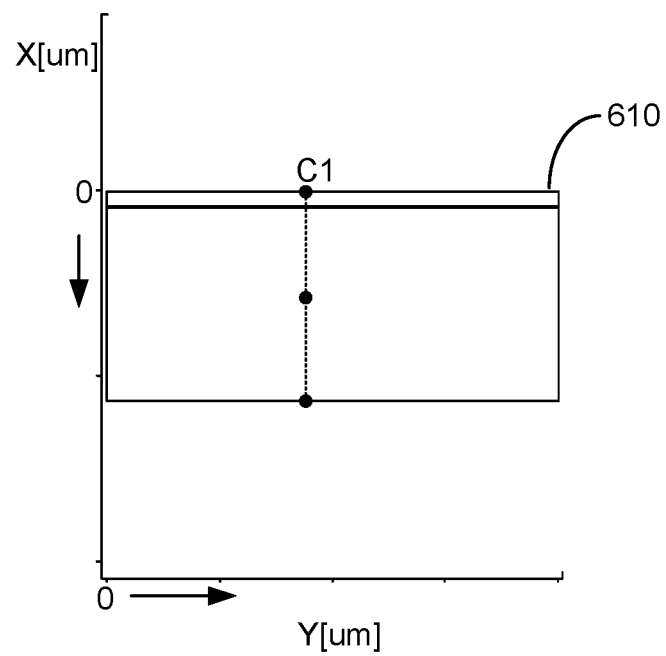
FIGS. 6A and 6B illustrate example dopant concentrations in a rectangular cross section of an example diode not having a universal contact in its cathode structure.
Figure 6B:
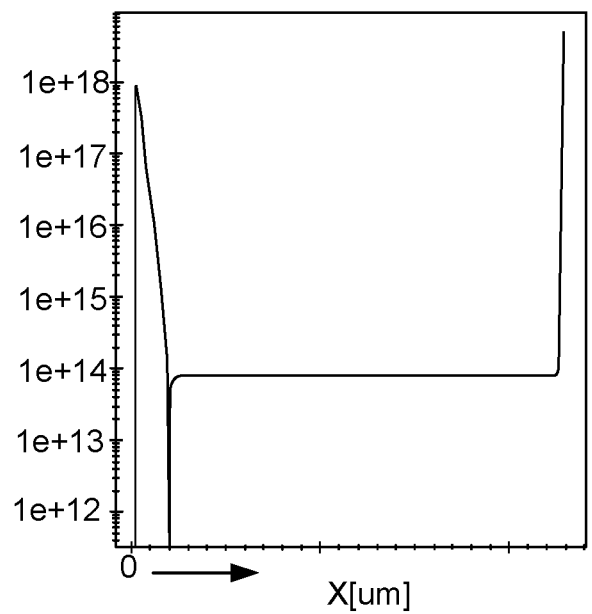

FIG. 6A is a X-Y plot of a cross-section of diode 610 with a trace line C1 extending from a top of diode 610 to a bottom of diode 610. An example diode 610 may have a vertical die thickness t of about 0.114 millimeters and a lateral die area (e.g., in a plane perpendicular to FIG. 6A, not shown) of about 11 square millimeters. Diode 610 has a conventional cathode structure (i.e. without a backside p-n-junction). FIG. 6B is a X-Y plot illustrating dopant concentrations in diode 610 along trace line C1.

Figure 7A:
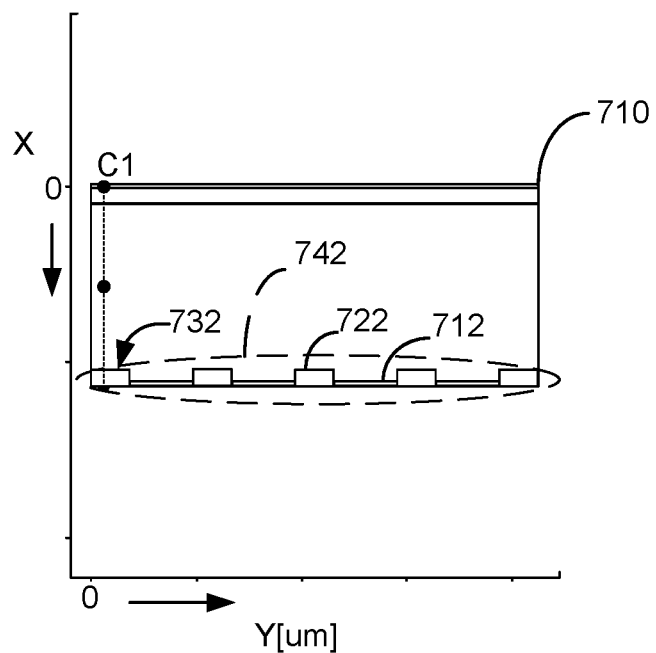
FIGS. 7A and 7B illustrate example dopant concentrations in a rectangular cross section of an example diode having a universal contact in its cathode structure.
Figure 7B:
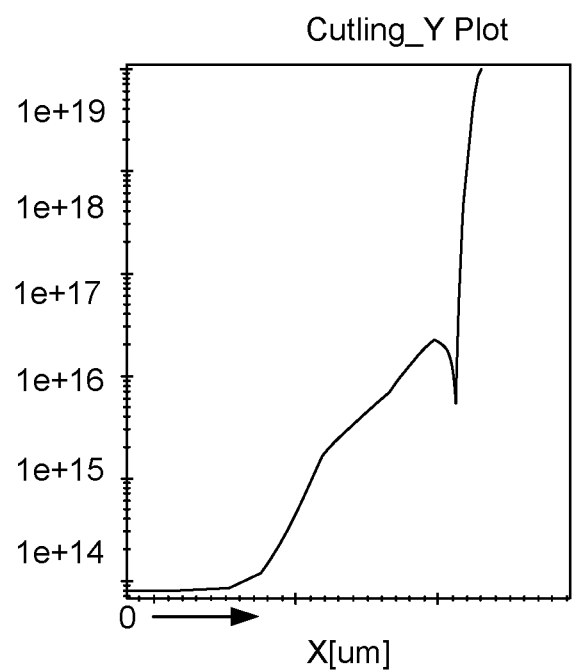

FIG. 7A is a X-Y plot of a cross-section of diode 710 with a trace line C1 extending from a top of diode 710 to a bottom of diode 710. An example diode 710 may have a universal contact including a N+ semiconductor region 712A and a P+ semiconductor region 722 forming a backside p-n junction 732. Diode 710 may have a vertical die thickness t of about 0.114 millimeters and a lateral die area (e.g., in a plane perpendicular to FIG. 7A, not shown) of about 11 square millimeters. FIG. 7B is a X-Y plot illustrating dopant concentrations in the universal contact region of diode 710 along trace line C1.

Figure 8:
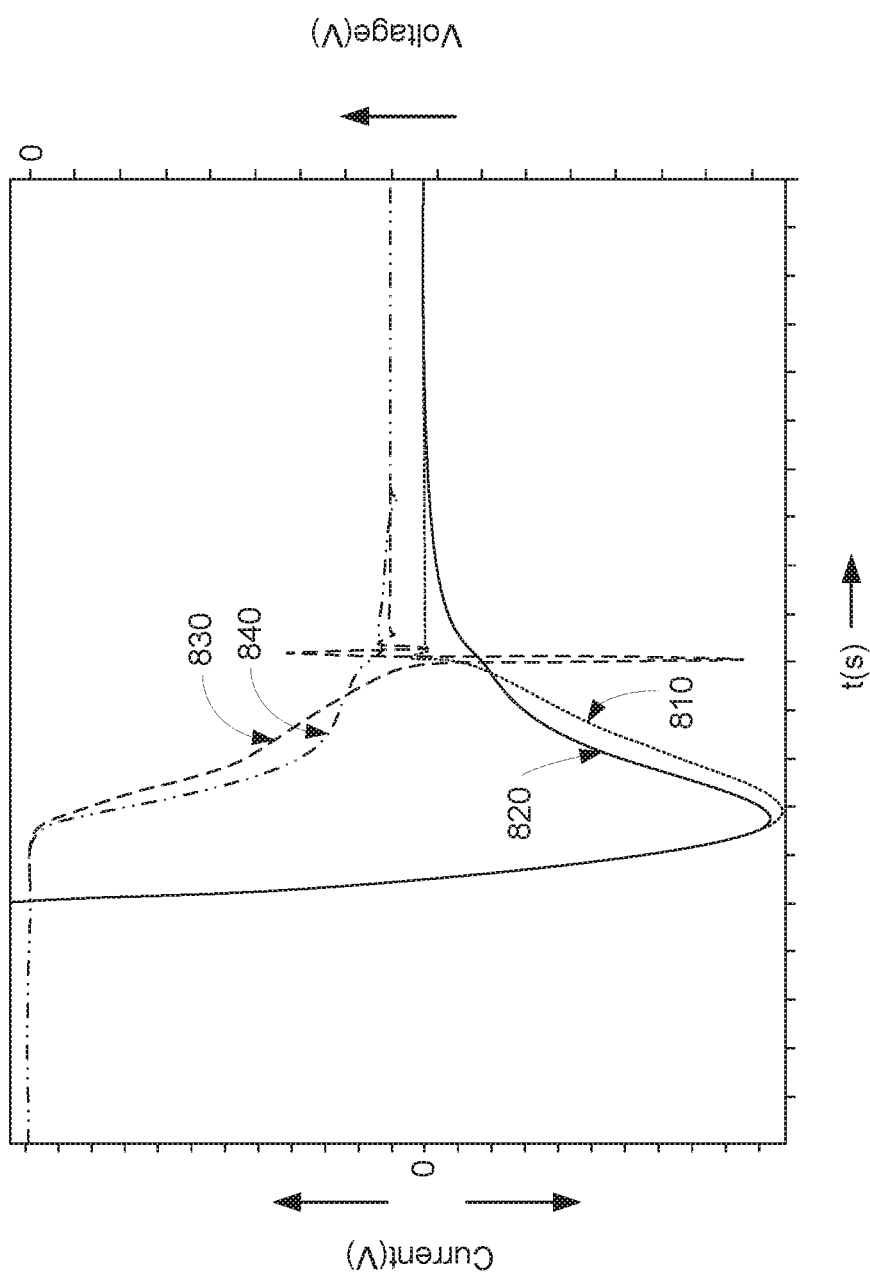
FIG. 8 is a graph illustrating simulated reverse recovery currents and voltages for an example diode without a backside p-n junction, and an example diode having a backside p-n junction in its cathode structure.

FIG. 8 is a graph illustrating simulated reverse recovery current 810 and voltage 830 for diode 610 (without a backside p-n junction), and reverse recovery current 820 and voltage 840 for diode 710 (with universal contact including a backside p-n junction in its cathode structure). The simulations were carried out using a Technology Computer-Aided Design (TCAD) tool with the diodes placed in an inductor-resistor circuit with the following parameters: diode area 11 mm2; die thickness 0.114 mms; reverse voltage (VR)=800 V; and forward current (IF)=40 A.

As seen in FIG. 8, on comparing reverse recovery current 820 and reverse recovery current 810, diode 710 (with a universal contact including a backside p-junction) exhibits a softer recovery than diode 610 (without a universal contact).

Figure 9B:
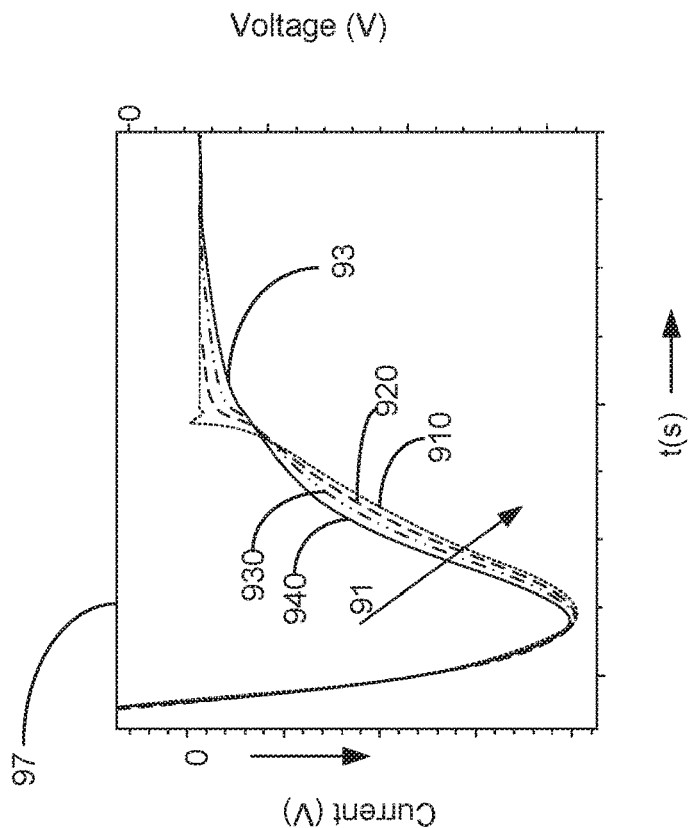
FIG. 9B is an exploded view of a portion of the graph of FIG. 9A.
Figure 9A:
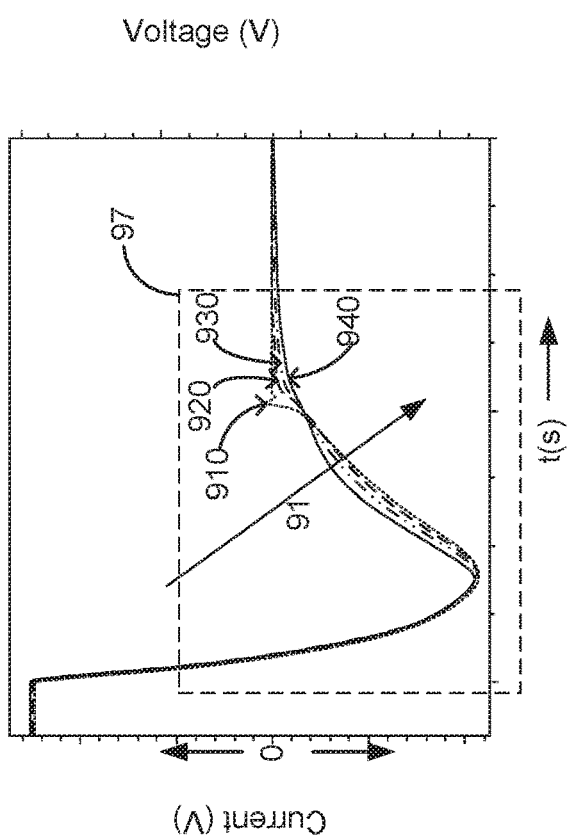
FIG. 9A is a graph illustrating simulated reverse recovery currents for a set of diodes having different p-to-n areal ratios in the universal contacts of the diodes.

FIG. 9A shows simulated reverse recovery currents for a set of diodes having different p-to-n areal ratios in the universal contacts of the diodes. Reverse recovery current 910 corresponds to a diode having a universal contact p-to-n areal ratio of zero:200 (i.e., a diode without a universal contact); reverse recovery current 920 corresponds to a diode having a universal contact p-to-n areal ratio of 50:100; reverse recovery current 930 corresponds to a diode having a universal contact p-to-n areal ratio of 100:100; and reverse recovery current 940 corresponds to a diode having a universal contact p-to-n areal ratio of 150:100.

A portion of FIG. 9A is enclosed in dashed line rectangular box 97. FIG. 9B shows an exploded view of the portion of FIG. 9A is enclosed in the dashed line rectangular box 97.

In FIGS. 9A and 9B, an arrow 91 is overlaid across the reverse recovery current curves as a visual aid to indicate a direction of increasing p-to-n areal ratios (i.e., (zero:100 to 150:100) in the universal contacts of the diodes.

A length of a tail of the reverse current curve approaching zero is a measure of the softness of the reverse current recovery of the diode. As seen in FIGS. 9A and 9B, a tail 93 of the reverse recovery currents increases in length as the p-to-n areal ratios in the universal contacts of the diodes increase. Thus, increasing the p-to-n areal ratio in the universal contact of a diode is likely to increase softness of the reverse current recovery of the diode.

Figure 10:
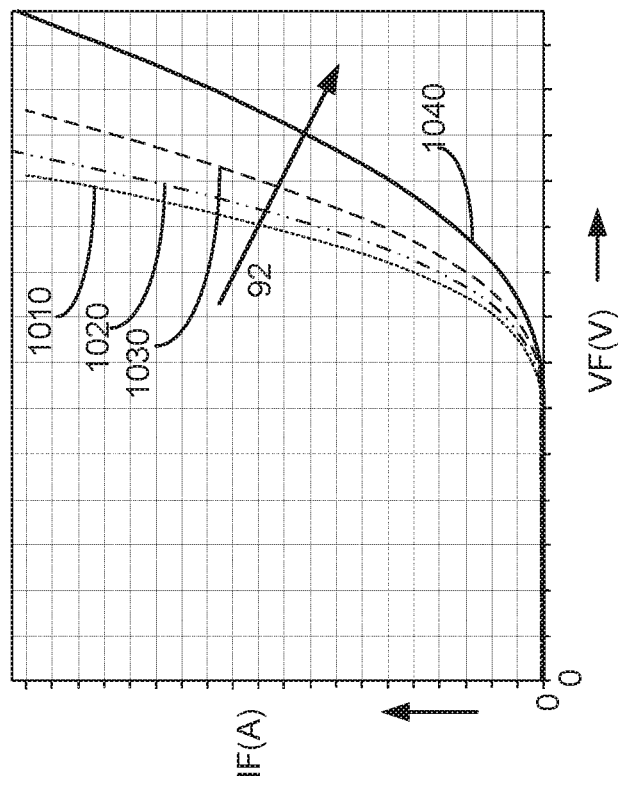
FIG. 10 is a graph illustrating simulated forward currents (IF) as a function of forward voltage (VF) for a set of diodes having different p-to-n areal ratios in the universal contacts of the diodes.

FIG. 10 shows simulated forward currents (IF) as a function of forward voltage (VF) for a set of diodes having different p-to-n areal ratios in the universal contacts of the diodes. Forward current 1010 corresponds to a diode having no universal contact (i.e., a diode without a universal contact); forward current 1020 corresponds to a diode having a universal contact p-to-n areal ratio of 50:150 (i.e., 0.33:1); forward current 1030 corresponds to a diode having a universal contact p-to-n areal ratio of 100:100 (i.e., 1:1); and forward current 1040 corresponds to a diode having a universal contact p-to-n areal ratio of 150:100 (i.e., 1.5:1).

Figure 11:
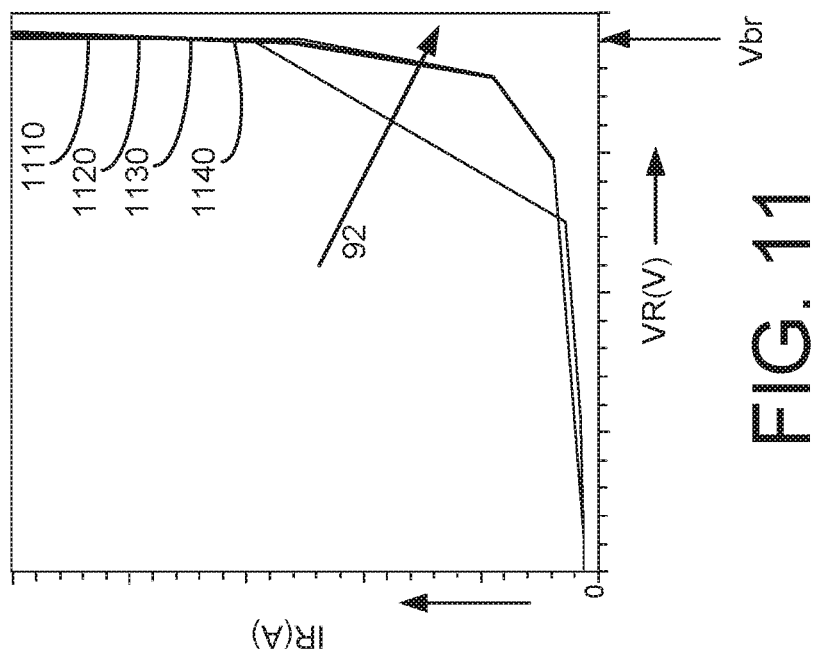
FIG. 11 is a graph illustrating simulated reverse load currents (IR) as a function of load voltage (VR) for the same set of diodes as FIG. 10.

FIG. 11 shows simulated reverse load currents (IR) as a function of load voltage (VR) for the same set of diodes as FIG. 10. Reverse load current 1110 corresponds to a diode having no universal contact p-to-n areal ratio (i.e., a diode without a universal contact); reverse load current 1120 corresponds to a diode having a universal contact p-to-n areal ratio of 50:150 (i.e., 0.33:1); reverse recovery current 1130 corresponds to a diode having a universal contact p-to-n areal ratio of 100:100 (i.e., 1:1); and reverse recovery current 1140 corresponds to a diode having a universal contact p-to-n areal ratio of 150:100 (i.e., 1.5:1).

An arrow 92 is overlaid across the forward current curves in FIG. 10 (and the reverse load current curves in FIG. 11) as a visual aid to indicate a direction of increasing p-to-n areal ratios (i.e., zero:200 to 150:100) in the universal contacts of the diodes.

As seen in FIG. 10, the forward voltages of the diodes increase as the p-to-n areal ratio in the universal contacts of the diode increases (e.g., from zero:200 to 150:50). However, as seen in FIG. 11, the reverse load current curves (1110, 1120, 1130, and 1140) for different p-to-n areal ratios are bunched up together and substantially overlap each over a voltage range of 1500V to 170V. Increases of the p-to-n areal ratios in the universal contacts of the diodes appear to have no effect on the breakdown voltages (Vbr) of the diodes (in other words, the breakdown voltages Vbr of the diodes do not appear to depend on the p-to-n areal ratios).

Figure 12:
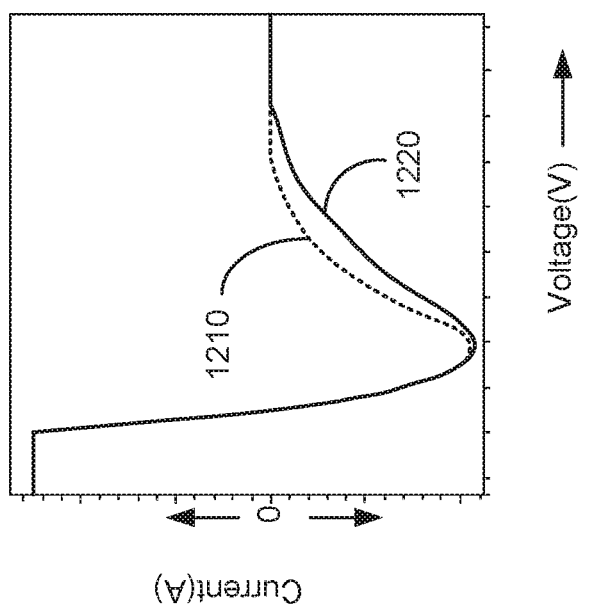
FIG. 12 is a graph illustrating simulated reverse recovery currents for a diode with no oxide layer included in its universal contact and a diode with an oxide layer covering the p-regions of its universal contact.

As noted previously (with reference to FIG. 3) the characteristics of the diodes can be further improved by including an oxide layer in the universal contacts. FIG. 12 shows a simulated reverse recovery current 1210 for a diode with no oxide layer included in its universal contact (which, e.g., has a p-to-n areal ratio of 75:25 (i.e., 3:1)). For comparison, FIG. 12 also shows a simulated reverse recovery current 1220 for a diode with an oxide layer covering the p-regions of its universal contact (which, e.g., has a p-to-n areal ratio of 50:50 (i.e., 1:1)).

Figure 13:
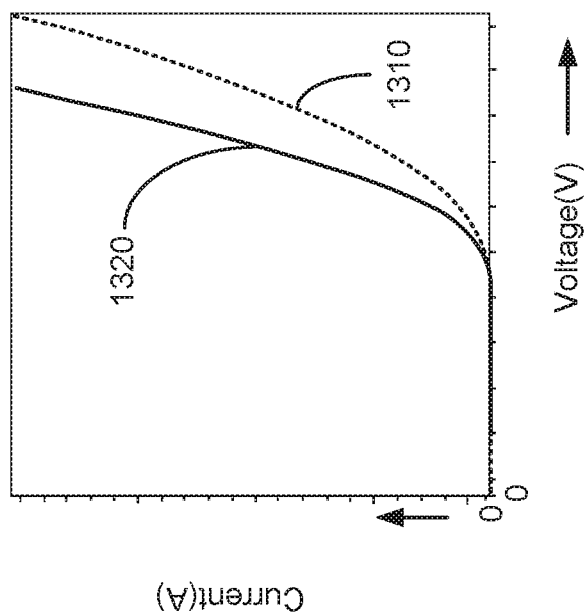
FIG. 13 is a graph illustrating simulated forward currents for the diodes of FIG. 12.

FIG. 13 shows a simulated forward current 1310 for the diode with no oxide layer included in its universal contact (which, e.g., has a p-to-n areal ratio of 75:25 (i.e., 3:1)). For comparison, FIG. 13 also shows a simulated forward current 1320 for the diode with an oxide layer cover the p-regions of its universal contact (which, e.g., has a p-to-n areal ratio of 50:50 (i.e., 1:1)).

As seen in FIG. 12 (on comparison of current 1210 and current 1220), introducing the oxide layer in the universal contact results in a softer reverse current recovery in the diode. As seen in FIG. 13 (on comparison of current 1310 and current 1320), introducing the oxide layer in the universal contact results in a smaller forward current in the diode.

The simulated currents and voltages described above with reference to FIG. 6A through FIG. 13 demonstrate that incorporating a universal contact including a backside p-n junction in the cathode structure improves the soft reverse current recovery characteristics of the diode. Including an oxide layer over P-regions of the universal contact additionally improves reverse current recovery of the diode.

It will also be understood that when an element, such as a transistor or resistor, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application (if included) may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes an industrial motor driver, a solar inverter, ballast, a general-purpose half-bridge topology, an auxiliary and/or traction motor inverter driver, a switching mode power supply, an on-board charger, an uninterruptible power supply (UPS), a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A device comprising:
a first doped semiconductor layer and a second oppositely doped semiconductor layer that are separated by a semiconductor drift region;
and
an electrode structure making a universal contact with the second oppositely doped semiconductor layer the universal contact allowing flow of both electrons and holes, the electrode structure including at least one doped semiconductor region of a first conductivity type and at least one semiconductor region of a second conductivity in contact with the second oppositely doped semiconductor layer, the electrode structure further including an oxide layer disposed between the at least one doped semiconductor region of the first conductivity type and a metal or metal alloy layer.

2. The device of claim 1, wherein the at least one doped semiconductor region of the first conductivity type includes at least one P+ doped semiconductor region and the at least one semiconductor region of the second conductivity includes at least one N+ doped semiconductor region.

3. The device of claim 2, wherein the at least one P+ doped semiconductor region and the at least one N+ doped semiconductor region are disposed between the metal or metal alloy layer and the second oppositely doped semiconductor layer.

4. The device of claim 3, wherein the electrode structure includes a plurality of P+ doped semiconductor regions alternating with a plurality of N+ doped semiconductor regions disposed between the metal or metal alloy layer and the second oppositely doped semiconductor layer.

5. The device of claim 1, wherein at least one P+ doped semiconductor region has a first area of contact with the second oppositely doped semiconductor layer, and at least one N+ doped semiconductor region has a second area of contact with the second oppositely doped semiconductor layer, a ratio of the first area and the second area forming a P-to-N areal ratio of the universal contact.

6. The device of claim 5, wherein the P-to-N areal ratio determines a reverse current recovery time of the device.

7. The device of claim 5, wherein the P-to-N areal ratio determines a forward current of the device.

8. The device of claim 5, wherein the P-to-N areal ratio is between 0.2:1 and 5:1.

9. The device of claim 1, wherein the first doped semiconductor layer is a P-doped semiconductor region, the second oppositely doped semiconductor layer is an N-type semiconductor substrate region having a resistivity in a range of 0.001 to 50 $\Omega$-cm, and the semiconductor drift region is an N-type epitaxial semiconductor region having a resistivity in a range of 20 to 200 $\Omega$-cm.

10. The device of claim 9, wherein the first doped semiconductor layer includes a P+ layer formed on a top surface of an N-type epitaxial layer and a metal layer deposited on the P+ layer.

11. A device comprising:
a doped semiconductor region in contact with a semiconductor drift region;
and
an electrode structure including an alternating array of P+ doped semiconductor regions and N+ doped semiconductor regions in contact with the second doped semiconductor region, the electrode structure including an oxide layer disposed between a metal layer and the alternating array of the P+ doped semiconductor regions and the N+ doped semiconductor regions.

12. The device of claim 11, wherein the oxide layer covers the P+ doped semiconductor regions and extends partially over the N+ doped semiconductor regions of the alternating array.

13. A device comprising:
an epitaxial semiconductor layer disposed on a semiconductor substrate; and
a universal contact structure disposed on a back surface of the semiconductor substrate,
the universal contact structure including photolithographically patterned and implanted regions of a first conductivity type and a second conductivity type disposed on the back surface of the semiconductor substrate, the regions of the first conductivity type and the second conductivity type including laser annealed dopants, and a patterned oxide layer disposed over the regions of the first conductivity type and partially over the regions of the second conductivity type.

14. The device of claim 13, wherein the regions of the first conductivity type and the second conductivity type include photolithographically patterned and implanted P+ regions and N+ regions disposed on the back surface of the semiconductor substrate, the P+ regions including laser annealed p-dopants and the N+ regions including laser annealed n-dopants.

15. The device of claim 13, wherein a back metal is disposed over the oxide layer.

16. The device of claim 13, wherein the semiconductor substrate is a N-type semiconductor substrate having a resistivity in a range of 0.01 to 10 $\Omega$-cm, and the epitaxial semiconductor layer is a N-type epitaxial layer has having a resistivity in a range of 20 to 200 $\Omega$-cm.

17. The device of claim 16, further comprising: a P+ layer formed on a top surface of the N-type epitaxial layer; and
a metal layer disposed on the P+ layer.

18. The device of claim 17, wherein the P+ layer includes p dopant species thermally diffused, and/or implanted, into the top surface of the n-type epitaxial layer.

* * * * *